(12) United States Patent
Finch

(10) Patent No.: US 7,308,396 B2
(45) Date of Patent: Dec. 11, 2007

(54) GENERATING CO-SIMULATION AND PRODUCTION EXECUTABLES FROM A SINGLE SOURCE

(76) Inventor: Peter Finch, 12330 SW. Alberta, Tigard, OR (US) 97223

( * ) Notice: Subject to any disclaimer, the term of this patent is extended or adjusted under 35 U.S.C. 154(b) by 489 days.

(21) Appl. No.: 10/862,913

(22) Filed: Jun. 7, 2004

(65) Prior Publication Data

US 2004/0226000 A1  Nov. 11, 2004

Related U.S. Application Data

(63) Continuation of application No. 09/058,726, filed on Apr. 10, 1998, now Pat. No. 6,766,284.

(51) Int. Cl.
*G06F 9/44* (2006.01)
*G06F 9/455* (2006.01)

(52) U.S. Cl. ............................. 703/23; 703/20; 703/21

(58) Field of Classification Search ............ 703/20–21, 703/23
See application file for complete search history.

(56) References Cited

U.S. PATENT DOCUMENTS 6,026,230 A   2/2000  Lin et al.

OTHER PUBLICATIONS

Chiodo et al.; Hardware-Software codesign of embedded systems; pp. 26-36, 1994; IEEE Micro.*
Zivojnovic et al.; Compiled HW/SW Co-Simulation; 1996 DAC; pp. 1-6.*
Tammemae et al., "AKKA: A Tool Kit for Cosynthesis and Prototyping," IEEE Coll. Hardware-Software Cosynthesis for Reconfigurable Systems, pp. 8/1-8/8, Feb. 1996.
Bishop et al., "A Heterogeneous Environment for Hardware/Software Cosimulation," IEEE 30th Annual Simulation Symposium, pp. 14-22, Apr. 1997.
Valderrama et al., "A Unified Model for Co-Simulation and Co-Synthesis of Mixed Hardware/Software Systems," European Design and Test Conference, pp. 180-184, Mar. 1995.
Klein, "Miami: A Hardware/Software Co-Simulation Environment," IEEE Int. Workshop on Rapid Systems Prototyping, pp. 173-177, Jun. 1996.
Wilson, "Hardware/Software Selected Cycle Solution," Proceedings of the Third International Workshop on Hardware/Software CoDesign (Cat. No. 94th 0700-05), Grenoble, France, Sep. 22-24, 1994, pp. 190-194, XP002169111 1994, Los Alamitos, CA, USA, IEEE Comput. Soc. Press, USA.
Yasuda et al., "A Top-Down Hardware/Software Co-Simulation Method for Embedded Systems Based Upon a Component Logical Bus Architecture," Proceedings of the ASP-DAC '98 Asian and South Pacific Design Automation Conference 1998 (Cat. No. 98EX121), Yukohama, Japan, Feb. 10-13, 1998, pp. 169-175, XP002169112 1998, New York, NY, USA, IEEE, USA.

* cited by examiner

*Primary Examiner*—Hugh Jones
(74) *Attorney, Agent, or Firm*—Klarquist Sparkman, LLP

(57) ABSTRACT

A storage medium is disclosed. The storage medium having stored on it a set of programming instructions defining a number of data objects and operations on the data objects for use by another set of programming instructions to enable the other set of programming instructions to be compilable into either a version suitable for use in a hardware/software co-simulation that effectively includes calls to hardware simulation functions that operate to generate bus cycles for a hardware simulator, or another version without the effective calls, but explicitly expressed instead, suitable for use on a targeted hardware.

12 Claims, 7 Drawing Sheets

```
ifndef hce_ptr_h ifndef EMBEDDED_TARGET                    ⟵ 212a
ifndef hce_h
#include <hce.h>
endif template<class DataType> class HcePtr;
// HceData
//
//      This is the template for data objects referenced by the pointers.
//      All simulator accesses are performed by this class. All public
//      operators defined on this class are the operators that may be
//      used on the dereferenced data.

template<class DataType> class HceData {
   unsigned long Address;
public:
   HceData (unsigned long address)  : Address(address) {}
   // Data is constructed with its HCE address HcePtr<DataType> operator& () const;              ⟵ 204a DataType operator=(DataType data) {               ⟵ 204b
        return hce_rput(data) ;
   }

DataType operator=(const HceData &other) {        ⟵ 204c
        return hce_rput((DataType) other) ;
   } operator DataType () const { return hce_get () ; }   ⟵ 204d

DataType operator++() {return hce_rput ( hce_get () +1) ; }   ⟵ 204e

DataType operator++(int) {
        DataType t = hce_get();                       ⟵ 204f
        hce_put(t + 1);
        return t;
   }

DataType operator -- () {return hce_rput ( hce_get () - 1) ; }   ⟵ 204g

DataType operator --(int) {
        DataType t = hce_get();                       ⟵ 204h
        hce_put(t - 1);
        return t;
   }
}
```

204 { (brace grouping the class body)

```
// The implementations for the private put and get functions are
// different for each data type. They are implemented here.

inline void HceData<char>::hce_put (char data)
{ hce_WriteByte(data, Address) ; } inline char HceData<char>::hce_get () const
{ return hce_ReadByte(Address) ; } inline void HceData<unsigned char>::hce_put (unsigned char data)
{ hce_WriteByte(data, Address) ; } inline unsigned char HceData<unsigned char>::hce_get () const
{ return hce_ReadByte(Address) ; } inline void HceData<short>::hce_put (short data)
{ hce_WriteShort(data, Address) ; } inline short HceData<short>::hce_get () const
{ return hce_ReadShort(Address) ; } inline void HceData<unsigned short>::hce_put (unsigned short data)
{ hce_WriteShort(data, Address) ; } inline unsigned short HceData<unsigned short>::hce_get () const
{ return hce_ReadShort(Address) ; } inline void HceData<long>::hce_put (long data)
{ hce_WriteLong(data, Address) ; } inline long HceData<long>::hce_get () const
{ return hce_ReadLong(Address) ; } inline void HceData<unsigned long>::hce_put (unsigned long data)
{ hce_WriteLong(data, Address) ; } inline unsigned long HceData<unsigned long>::hce_get () const
{ return hce_ReadLong(Address) ; } inline void HceData<float>::hce_put (float data)
{ hce_WriteLong(*(long*) &data, Address) ; } inline float HceData<float>::hce_get () const
{ long t = hce_ReadLong(Address); return *(float *) &t; } inline void HceData<double>::hce_put (double data)
{ hce_WriteDoubleLong(*(HceDoubleLong *) &data, Address); } inline double HceData<double>::hce_get () const
{ HceDoubleLong t = hce_ReadDoubleLong(Address); return *(double*) &t; }
```

```
// Modification operators on HceData.
//
// These are not HceData member functions because they cause errors
// on HceData<float> and HceData<double>.
```

214 {
```
template<class DataType, class ArgType> inline
DataType operator%= (HceData<DataType> o, ArgType v) {
return (o = ( (DataType)o) % v) ;
} template<class DataType, class ArgType> inline
DataType operator|= (HceData<DataType> o, ArgType v) {
return (o = ( (DataType)o) | v) ;
} template<class DataType, class ArgType> inline
DataType operator&= (HceData<DataType> o, ArgType v) {
return (o = ( (DataType)o) & v) ;
} template<class DataType, class ArgType> inline
DataType operator^= (HceData<DataType> o, ArgType v) {
return (o = ( (DataType)o) ^ v) ;
} template<class DataType, class ArgType> inline
DataType operator<<= (HceData<DataType> o, ArgType v) {
return (o = ( (DataType)o) << v) ;
} template<class DataType, class ArgType> inline
DataType operator>>= (HceData<DataType> o, ArgType v) {
return (o = ( (DataType)o) >> v) ;
}
```

FIG. 2D

```
// HcePtr
//
// This is a template for the pointers. All public operators defined on this class
// are the operator that may be used on the pointers.

template<class DataType> class HcePtr { unsigned long Address;

public:

HcePtr (unsigned long address = 0) : Address (address) {}

HceData<DataType> operator *() const
    { return HceData<DataType>(Address) ; }                              // 202a operator unsigned long () const { return Address; }                  // 202b HcePtr operator+(int i) const
    { return HcePtr(Address - (i * sizeof (DataType))); }                // 202c HcePtr operator-(int i) const
    { return HcePtr(Address - (i * sizeof (DataType))); }                // 202d int operator-(HcePtr other) const
    { return (Address - other.Address) / sizeof(DataType); }             // 202e HcePtr operator++()    { *this = *this + 1; return *this; }          // 202f HcePtr operator++(int) { *this = *this + 1; return *this - 1; }      // 202g HcePtr operator --()   { *this = *this - 1; return *this; }          // 202h HcePtr operator --(int){ *this = *this - 1; return *this + 1; }      // 202i HcePtr operator+=(int d) { *this = *this + d; return *this; }        // 202j HcePtr operator -=(int d) { *this = *this - d; return *this + 1; }   // 202k HceData<DataType> operator[] (int i) const
    { return HceData<DataType> ((*this + i) .Address); }                 // 202l

};

template<class DataType> inline
    HcePtr<DataType> HceData<DataType>::operator&() const
    { return HcePtr<DataType>(Address); }
```

FIG. 2E

```
// The final names (without template syntax) of the pointer types
// defined here.
```

```
        ⎧ typedef HcePtr<char>            HceCharPtr;
        ⎜ typedef HcePtr<unsigned char>   HceUCharPtr;
        ⎜ typedef HcePtr<short>           HceShortPtr;
        ⎜ typedef HcePtr<unsigned short>  HceUShortPtr;
206 ────┤ typedef HcePtr<long>            HceLongPtr;
        ⎜ typedef HcePtr<unsigned long>   HceULongPtr;
        ⎜ typedef HcePtr<float>           HceFloatPtr;
        ⎩ typedef HcePtr<double>          HceDoublePtr;
212b
   └── #else
```

```
/* The same pointer type names are redefined here for programs
 * compiled with -DEMBEDDED_TARGET. */
```

```
        ⎧ typedef  char             *HceCharPtr;
        ⎜ typedef  unsigned char    *HceUCharPtr;
        ⎜ typedef  short            *HceShortPtr;
        ⎜ typedef  unsigned short   *HceUShortPtr;
208 ────┤ typedef  long             *HceLongPtr;
        ⎜ typedef  unsigned long    *HceULongPtr;
        ⎜ typedef  float            *HceFloatPtr;
        ⎩ typedef  double           *HceDoublePtr;
212c
   └── #endif endif
```

FIG. 2F

GENERATING CO-SIMULATION AND PRODUCTION EXECUTABLES FROM A SINGLE SOURCE

CROSS-REFERENCE TO PRIOR APPLICATIONS

This application is a continuation of U.S. Pat. application No. 09/058,726, filed Apr. 10, 1998, now U.S. Pat. No. 6,766,284, which is hereby incorporated by reference.

BACKGROUND OF THE INVENTION

1. Field of the Invention

The present invention relates to the field of digital system design verification and production. More specifically, the present invention relates to design verification and production of digital systems whose development efforts are neither hardware nor software dominant.

2. Background Information

The majority of digital systems being designed today are task specific embedded systems that consist of standard and/or custom hardware as well as standard and/or custom software. Standard hardware typically includes off-the-shelf microprocessor/micro-controller, and memory etc., whereas custom hardware is implemented with programmable logic devices (PLDs), or Application Specific Integrated Circuits (ASICs). Hardware architecture binds and constrains these resources and provides a framework on which software processes execute. Standard software typically includes a real time operating system (RTOS), and configurable device drivers, whereas customer software is the embedded application. Software architecture defines how these processes communicate.

The complexity of these systems varies widely from low to high end depending on the market segment and product goals. They can be found in almost everything that we encounter in our daily lives, such as communication systems ranging from the phone on our desk, to the large switching centers, automobiles, consumer electronics, etc.

Some embedded systems are software dominant in their development effort, in that most of the design efforts are focused on implementing the functionality in software. Typically, standard or previously designed hardware are employed. Thus, even though the software dominant characteristic typically makes these systems a lot more cost sensitive, these systems can be readily validated by compiling and debugging the software under development on existing hardware, using a compiler, a debugger and other related software tools.

Other embedded systems are hardware dominant, in that most of the design efforts are focused on implementing the functionality in PLDs or ASICs. The original software content of these systems tends to be small. Typically, these embedded systems are found in applications where performance is critical. For these systems, hardware emulation and/or simulation techniques known in the art appear to adequately serve the design verification needs. In the case of emulation, the hardware is "realized" by configuring the reconfigurable logic and interconnect elements of the emulator. The configuration information are generated by "compiling" certain formal behavioral specification/description of the hardware. In the case of simulation, a simulation model would be developed. For the more "complex" hardware, since it is very difficult, if not outright impossible, to model all the behaviors of the hardware, certain accuracy are often sacrificed. For example, in the case of a microprocessor, it is often modeled by a "bus interface model", i.e. only the different bus cycles that the processor can execute are modeled. The modeled bus cycles are driven in timed sequences, representative of typical bus transactions or bus activities for invoking specific conditions.

Embedded systems that are most difficult to validate are those that are neither software or hardware dominant, in that both parts play an equally important role in the success of the system. Due to increased time to market pressures, hardware and software are usually developed in parallel. Typically, the hardware designers would validate the hardware design using an hardware simulator or emulator. Concurrently, the software designer would validate the software using an instruction set simulator on a general purpose computer. The instruction set simulator simulates execution of compiled assembly/machine code for determining software correctness and performance at a gross level. These instruction set simulators often include facilities for handling I/O data streams to simulate to a very limited degree the external hardware of the target design. Typically, instruction set simulators run at speeds often thousand to several hundred thousand instructions per second, based on their level of detail and the performance of the host computer that they are being run on.

Traditionally, the hardware and software would not be validated together until at least a prototype of the hardware, having sufficient amount of functionality implemented and stabilized, becomes available. The software is executed with a hardware simulator, and very often in cooperation with a hardware modeler (a semiconductor tester), against which the hardware prototype is coupled. The hardware simulator provides the hardware modeler with the values on the input pins of the prototype hardware, which in turn drives these values onto the actual input pins of the prototype hardware. The hardware modeler samples the output pins of the prototype hardware and returns these values to the hardware simulator. Typically, only one to ten instructions per second can be achieved, which is substantially slower than instruction set simulation.

Recently, increasing amounts of research effort in the industry has gone into improving hardware and software co-simulation. New communication approaches such as "message channels" implemented e.g. using UNIX® "pipes" have been employed to facilitate communication between the hardware and software models (LTNIX is a registered trademark of Santa Cruz Software, Inc.). Other efforts have allowed the models to be "interconnected" through "registers", "queues", etc. However, even with the improved communication techniques, and employment of less complete models, such as "bus interface models" for a microprocessor, hardware and software co-simulation known in the art remain running substantially slower than instruction set simulation.

In U.S. patent application, Ser. No. 08/645,620, now U.S. Pat. No. 5,768,567, assigned to the same assignee of the present invention, an improved hardware-software co-simulator is disclosed. Under the disclosed co-simulator, co-simulation of a hardware-software system is performed with a single coherent view of the memory of the hardware-software system. This single coherent view is transparently maintained for both the hardware and software simulations, and includes at least one segment of the memory being viewed as configured for having selected portions of the segment to be statically or dynamically configured/reconfigured for either unoptimized or optimized accesses, wherein unoptimized accesses are performed through hardware simulation, and optimized accesses are performed "directly", by-passing hardware simulation. The co-simulation may be performed with or without simulation time optimization, statically or dynamically configured/reconfigured, and optionally in accordance with a desired clock cycle ratio between hardware and software simulations, also statically or dynamically configured/reconfigured.

Additionally, the software simulation may be performed using either instruction set simulators or Host Code Execution (HCE) applications. An HCE application is a user-written program that emulates the working of embedded software. Instead of running on the embedded processor or even on an instruction set simulator, an HCE application is compiled and executed on a general purpose computer. The HCE application calls pre-supplied HCE functions to generate the hardware bus cycles for the hardware simulator.

In an ideal situation, once the HCE application has been used to verify the workings of the embedded system, the same source code can be carried to subsequent levels of verification and ultimately into the actual production of the embedded software. However, because of the use of HCE functions, it has been necessary to recode the HCE application to produce the production version. For example, consider the operation of writing a byte to a memory mapped output port at address 0×4000, the statements (in C) in the HCE version are coded as unsigned long port=0×4000;
hce_WriteByte('\1',port); //calling the hce_WriteByte function, whereas, the same statements in the production version are coded as
char*port=(char*)0×4000;
*port='\1';

Thus, it is desirable if the HCE executables for co-simulation and the production executables can be generated from the same source, without requiring modification. As will be disclosed in more detail below, the present invention achieves this and other desirable results.

SUMMARY OF THE INVENTION

A storage medium is disclosed. The storage medium having stored on it a set of programming instructions defining a number of data objects and operations on the data objects for use by another set of programming instructions to enable the other set of programming instructions to be compilable into either a version suitable for use in a hardware/software co-simulation that effectively includes calls to hardware simulation functions that operate to generate bus cycles for a hardware simulator, or another version without the effective calls, but explicitly expressed instead, suitable for use on a targeted hardware.

BRIEF DESCRIPTION OF DRAWINGS

The present invention will be described by way of exemplary embodiments, but not limitations, illustrated in the accompanying drawings in which like references denote similar elements, and in which:

FIGS. 2a-2f illustrate one embodiment of the HCE class definitions of FIG. 1.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system; and the term computer system include general purpose as well as special purpose data processing machines, systems, and the like, that are standalone, adjunct or embedded.

Various operations will be described as multiple discrete steps performed in turn in a manner that is most helpful in understanding the present invention, however, the order of description should not be construed as to imply that these operations are necessarily order dependent, in particular, the order of presentation.

Figure 1:
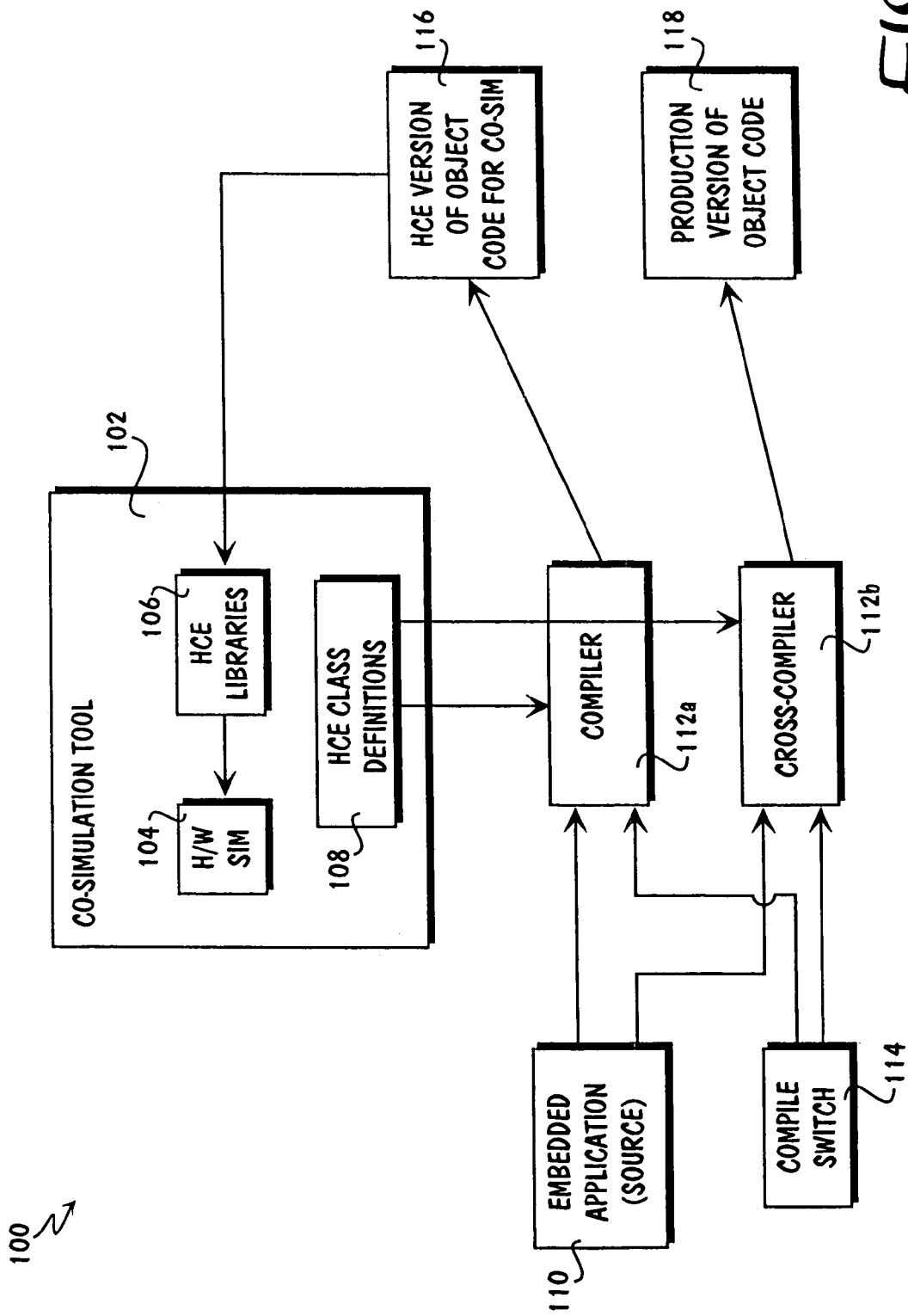
FIG. 1 gives a broad overview of the present invention.
Figures 2A, 2B:
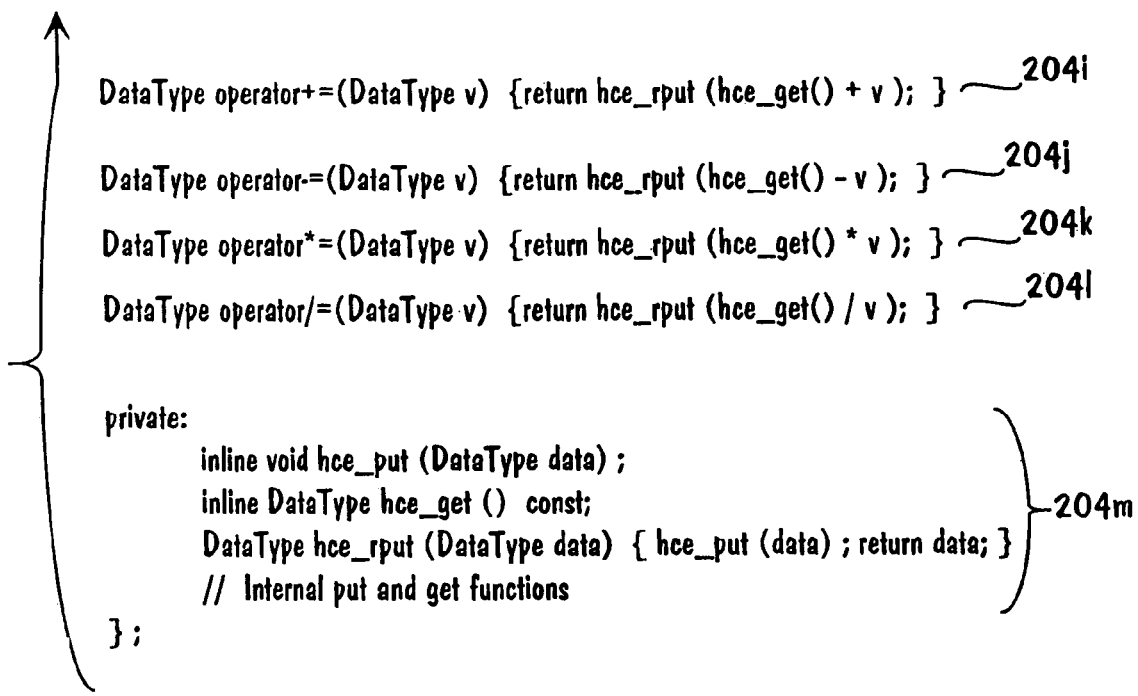

Referring now to FIG. 1, wherein a broad overview of the present invention is shown. As illustrated, under the present invention, embedded application 110 may be selectively compiled by compiler 112a into HCE version 116 for use in a hardware/software co-simulation, or by cross-compiler 112b into production version 118 for use on a targeted hardware, without requiring substantive modifications to embedded application 110. HCE version 116 and production version 118 differ from each other in that HCE version 116 effectively includes calls to HCE library functions 106 of co-simulation tool 102 to generate bus cycles for hardware simulator 104 of co-simulation tool 102, whereas production version 118 does not effectively include these calls, and the operations represented by these calls are explicitly expressed instead, suitable for native execution on the targeted hardware. For the purpose of this application, the terms production version and targeted hardware version are to be considered as synonymous.

This novel efficient approach to generating the two versions of object code 116 and 118 is innovatively made possible by coding embedded application 110 in accordance with the teachings of the present invention; more specifically, expressing various operations through references to certain data objects and operations on these data objects, where the data objects and the operations are defined in HCE class definitions 108 to conditionally map to the HCE library function calls described earlier. At compile time, in addition to embedded application 110, HCE class definitions 108 as well as compile time switch 114 denoting which version is to be generated are also provided to the compiler, i.e. compiler 112a or cross-compiler 112b. In response, compiler 112a would generate HCE version 116, while compiler 112b would generate production version 118.

In one embodiment, the provision of the compile time switch denoting which version is to be generated is implemented through the presence or absence of a pre-determined keyword, e.g. "embedded". When the keyword "embedded" is present, production version 118 is to be generated. If the keyword "embedded" is absent, HCE version 116 is to be generated. Thus, for the purpose of this application, terms such as "providing", "supplying" and so forth are intended to include the purposeful omission of certain information or acts.

Compilers 112a and 112b are intended to represent a broad range of compilers and associated cross-compilers known in the art. In one embodiment, compiler 112a is the off-the-shelf C++ compiler available from Bordland Corp. of Scotts Valley, Calif., and compiler 112b are conventional cross compilers employed by embedded hardware vendors. In other words, the logic that makes it possible to generate the two versions 116 and 118 from a single source resides in the innovative definitions provided in HCE class definitions 108, and the efficient practice is actually transparent to compiler 112a and cross-compiler 112b.

Except for HCE class definitions 108, co-simulation tool 102 is also intended to represent a broad range of co-simulation products known in the art, including but not limited to the improved co-simulator disclosed in U.S. Pat. No. 5,768,567, which is hereby fully incorporated by reference.

FIGS. 2a-2f illustrate one embodiment of HCE class definitions 108. For the illustrated embodiment, HCE class definitions 108 include definitions for a number of pointer classes, defined through template 202 using parameter DataType, and definitions for a number of data objects referenced by these pointers, defined through template 204 also using parameter DataType. Except for the defined "exclusions" 214, the various types of pointers and data objects include char, unsigned char, short, unsigned short, long, unsigned long, floating point, and double precision (see e.g. renaming statements 206 and 208, to be explained more fully below). "Exclusions" 214 are non-member functions defined to prevent certain error triggering invalid instantiations of HceData. Various operations on the pointers as well as the data objects are also defined. The definitions of the various operations on the pointers and the data objects are accomplished by overloading various standard operators of the C++ language. In the case of the data objects, as can be seen from the statements of statement group 210, which defines the internal hce_put and hce_get functions, the various operations on the data objects are mapped to HCE library functions 106, such as hce_WriteByte, hce_ReadByte, hce_WriteShort, hce_ReadShort, hce_WriteLong, hce_ReadLong, and so forth. Renaming statements 206 take effect when generating the HCE version of the object code, whereas renaming statements 208 take effect when generating the production version of the object code. As a result, proper naming of the various pointer types are provided for the respective object code versions of the embedded application.

More specifically, for HceData, statement 204b overloads the assignment operator (=) on DataType to map to a HCE write function, e.g. hce_WriteByte, hce_WriteShort etc. This enables writing data of a variable to a hardware address denoted by a pointer (*p=d, where p is the pointer and d is the variable) to be implementable in the HCE as well as the product version using the same source statements, employing the=operator on DataType.

Statement 204d overloads the conversion operator for DataType to map to a HCE read function, e.g. hce_ReadByte, hce_ReadShort etc. This enables various reading operations to be implementable in the HCE as well as the product version using the same source statements, employing the conversion operator. These reading operations include simple reading from a hardware address designated by a pointer and placing the result into a variable (d=*p), as well as reading a value (or values) from a hardware address (or addresses) designated by a pointer (or pointers), applying an arithmetic, logical or relational operation on the value and another operand (or the values) and storing the result in a variable (d=p@4, d=*p @*q, d=@*p, where q is also a pointer, 4 is another operand and @ is any arithmetic, logical or relational operation).

Statements 204e-204l overload the ++ and -- operators (prefix as well as postfix), and the +=, -=, *=, /= operators on DataType to map to various serial combinations of the HCE read and write functions, e.g. hce_ReadByte and hce_WriteByte etc. This enables various read-modify-write operations to be implementable in the HCE as well as the product version using the same source statements, employing the ++, --, +=, -=, *=, and /=operators. These read-modify-write operations include reading a value from a hardware address designated by a pointer, incrementing (or decrementing) the value and writing the value back as well as copying it to a variable (d=++(*p) and d=--(*p)), and reading a value from a hardware address designated by a pointer, placing the value in a variable, then incrementing (or decrementing) the value and writing the value back (d=(*p)++ and d=(*p)--). These read-modify-write operations further include reading a value (or values) from a hardware address (or addresses) designated by a pointer (pointers), applying an operation to the value and another operand (or the values), and then writing the result back to the hardware address (or one of the hardware addresses) (*p @=4 and *p @=*q, where @ is +, -, * and /).

Statement 204c overloads the = operator on HceData to map to a HCE write function, e.g. hce_WriteByte, hce_WriteShort etc. This enables a chained reading and writing operation (d=*q=*p) to be implementable in the HCE as well as the product version using the same source statements, employing the = operator on HceData. The chained reading and writing operation includes reading from a hardware address designated by a pointer, writing the value to another hardware address designated by another pointer, and then placing the result into a variable.

Statement 204a overloads the address-of operator on HceData to return the HcePtr of an HceData object. This enables the assignment of a pointer to another pointer (q=&(*p)) to be implementable in the HCE as well as the product version using the same source statements, employing the address-of operator. This is for consistency with C, although it is marginally useful if all HCE data objects are accessed through pointers.

In the case of HcePtr, statement 202a overloads the indirection operator (*) on HcePtr to return the HceData object pointed to by the HcePtr. This enables the indirect assignment of a data object to another data object to be implementable in the HCE as well as the product version using the same source statements, employing the same indirection operator (*). Statement 202b overloads the type conversion operator on HcePtr to convert the pointer to an unsigned long. This enables all pointer relational operations and test for a null pointer operation ((p @ q) and if (p) . . . , where @ is ==, >, <, <= etc.) to be implementable in the HCE as well as the product version using the same source statements, employing the type conversion operator.

Statements 202c-202l overloads the +, -, ++, -- and □ operators on HcePtr to perform like kind operations, i.e. +, -, ++ and -- on HcePtr and return the HcePtr. For the + and -- operators on HcePtr, statements 202c-202e take into account the size of DateType using the size of function.

This enables various +, − ++, and − operations on pointers (e.g. p+=10, p−=10, *(p+10)=d, *(p−10)=d, p[10]=d, d=*(++p), d=*(p++), d=*(−−p), d=*(p−−), and i=p−q) to be implementable in the HCE as well as the product version using the same source statements, employing the +, −, ++ and − operators respectively.

The above explained data object and operation definitions are conditionally applied correspondingly when generating the respective version of the object code. For the illustrated embodiment, this conditional corresponding application of the definitions is accomplished through the placement of the statement set (#ifndef EMBEDDED_TARGET, #else, and #endif) 212a-212c, "bracketing" the above described statements as shown. For the illustrated embodiment, "EMBEDDED_TARGET" is the compile switch denoting the production or targeted hardware version is to be generated.

Recalling the exemplary code segments discussed in the background, by coding the operation referencing data object HceCharPtr instead, i.e.

HceCharPtr port=(HceCharPtr) 0x4000;

*port="\1";

when compiling the code segment for the HCE version, the second statement will be effectively mapped to a call to the HCE library function hce_WriteByte, whereas when compiling the code segment for the production version, the data object name HceCharPtr will be properly renamed to char *.

Referring briefly back to FIG. 1, HCE class definitions 108 of the present invention is anticipated to be distributed to customers as a standalone component or as an integral part of co-simulation tool 102 through a variety of distribution methods and mediums. For examples, HCE class definitions 108 with or without the rest of co-simulation tool 102 may be embodied in a storage medium such as a tape, a disk, ROM, Flash Memory, a CDROM, a DVD, or downloaded to a computer from a remote server through one or more public or private networks. For the purpose of this application, the term storage medium is intended to represent all Volatile as well as non-volatile medium to which HCE class definitions 108 with or without the rest of co-simulator 102 may be stored.

While the method and apparatus of the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

Thus, a method and apparatus for generating co-simulation and production executables from a single source has been described.

What is claimed is:

1. An apparatus, comprising:
   means for receiving a plurality of programming instructions comprising source code for an embedded application;
   means for receiving a compile time switch; and
   means for compiling the plurality of programming instructions into at least one of a plurality of compiled versions based at least in part on the compile time switch.

2. The apparatus of claim 1, further comprising means for receiving a plurality of host code execution (HCE) class definitions.

3. The apparatus of claim 1, further comprising means for using the one of a plurality of compiled versions to act on a hardware simulator of a co-simulation tool.

4. A method of generating an executable from source code, comprising:
   a step for obtaining source code corresponding to an embedded application; and
   a step for compiling the source code into an executable based at least in part on a compile time switch denoting one of a plurality of compiling options, wherein the plurality of compiling options comprises a host code execution (HCE) option and a targeted hardware option.

5. The method of claim 4, further comprising a step for using an executable compiled pursuant to the HCTS option to interact with a co-simulation tool.

6. The method of claim 4, further comprising a step for obtaining a plurality of HCE class definitions, wherein the plurality of HCE class definitions comprises definitions of a plurality of pointer classes and definitions of a plurality of data objects.

7. The method of claim 6, wherein the plurality of HCE class definitions further comprises a plurality of operations that can be performed on at least one pointer according to one of the plurality of pointer classes and a plurality of operations that can be performed on at least one of the plurality of data objects.

8. A computer-readable medium comprising computer-executable instructions for causing a computer to perform the method of claim 4.

9. The apparatus of claim 1, wherein the plurality of compiled versions comprises a production version.

10. The apparatus of claim 1, wherein the plurality of compiled versions comprises a host code execution (HCE) version.

11. The method of claim 10, wherein the HCE version comprises at least one call to at least one of a plurality of HCE library functions.

12. The method of claim 10, further comprising using the HCE version to generate bus cycles for a hardware simulator of a co-simulation tool.

* * * * *

UNITED STATES PATENT AND TRADEMARK OFFICE
CERTIFICATE OF CORRECTION

PATENT NO.         : 7,308,396 B2
APPLICATION NO.    : 10/862913
DATED              : December 11, 2007
INVENTOR(S)        : Peter Finch It is certified that error appears in the above-identified patent and that said Letters Patent is hereby corrected as shown below:

In the Claims

Column 8,
Line 28, Claim 5, "HCTS" should be --HCE--

Signed and Sealed this
Twenty-fifth Day of August, 2015

Michelle K. Lee
*Director of the United States Patent and Trademark Office*